United States Patent
Ma

(10) Patent No.: US 9,793,884 B2
(45) Date of Patent: Oct. 17, 2017

(54) APPARATUSES AND METHODS FOR PHASE INTERPOLATING CLOCK SIGNALS AND FOR PROVIDING DUTY CYCLE CORRECTED CLOCK SIGNALS

(71) Applicant: Micron Technology, Inc., Boise, ID (US)

(72) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/332,811

(22) Filed: Oct. 24, 2016

(65) Prior Publication Data
US 2017/0040986 A1 Feb. 9, 2017

Related U.S. Application Data

(62) Division of application No. 13/936,965, filed on Jul. 8, 2013, now Pat. No. 9,503,066.

(51) Int. Cl.
| | |
|---|---|
| *H03K 5/15* | (2006.01) |
| *H03K 5/156* | (2006.01) |
| *H03K 19/003* | (2006.01) |
| *H03K 19/013* | (2006.01) |
| *H03K 5/00* | (2006.01) |

(52) U.S. Cl.
CPC ............ *H03K 5/1565* (2013.01); *H03K 5/15* (2013.01); *H03K 19/003* (2013.01); *H03K 19/0136* (2013.01); *H03K 2005/00052* (2013.01)

(58) Field of Classification Search
CPC ...... H03K 5/1565; H03K 5/15; H03K 19/003; H03K 19/0136
USPC .......................................................... 327/175
See application file for complete search history.

(56) References Cited

U.S. PATENT DOCUMENTS

| | | | |
|---|---|---|---|
| 6,952,123 | B2 | 10/2005 | Kizer et al. |
| 7,069,522 | B1 | 6/2006 | Sluss et al. |
| 7,078,949 | B2 | 7/2006 | Kim et al. |
| 7,176,734 | B2 | 2/2007 | Park |
| 7,368,966 | B2 | 5/2008 | Hur |
| 7,884,659 | B2 | 2/2011 | Jang et al. |
| 7,961,017 | B2 | 6/2011 | Lee |
| 8,106,694 | B2 | 1/2012 | Kim |
| 8,149,034 | B2 | 4/2012 | Gomm |
| 2003/0179027 | A1 | 9/2003 | Kizer et al. |
| 2003/0218486 | A1 | 11/2003 | Kwak |

(Continued)

*Primary Examiner* — John Poos
(74) *Attorney, Agent, or Firm* — Dorsey & Whitney LLP

(57) ABSTRACT

Apparatuses and methods for phase interpolating clock signals and for providing duty cycle corrected clock signals are described. An example apparatus includes a clock generator circuit configured to provide first and second clock signals responsive to an input dock signal. A duty phase interpolator circuit may be coupled to the dock generator circuit and configured to provide a first and second duty cycle corrected interpolated clock signals. A duty cycle adjuster circuit may be coupled to the duty phase interpolator circuit and configured to receive the first and second duty cycle corrected interpolated clock signals and provide a duty cycle corrected dock signal responsive thereto. A duty cycle detector may be coupled to the duty cycle adjuster circuit and configured to detect duty cycle error of the duty cycle corrected clock signal and provide the adjustment signals to correct the duty cycle error.

24 Claims, 9 Drawing Sheets

(56) References Cited

U.S. PATENT DOCUMENTS

| | | |
|---|---|---|
| 2004/0189363 A1 | 9/2004 | Takano |
| 2007/0147564 A1 | 6/2007 | Fan et al. |
| 2007/0216464 A1 | 9/2007 | Roche et al. |
| 2008/0063125 A1 | 3/2008 | Chatwin |
| 2008/0309375 A1* | 12/2008 | Schnarr ............ G01R 31/31727 327/2 |
| 2010/0164571 A1 | 7/2010 | Jang et al. |
| 2011/0050304 A1 | 3/2011 | Kuroki et al. |
| 2014/0002155 A1 | 1/2014 | Park et al. |
| 2014/0253198 A1 | 9/2014 | Ma |
| 2014/0368244 A1 | 12/2014 | Ma |
| 2015/0008968 A1 | 1/2015 | Ma |
| 2015/0102844 A1 | 4/2015 | Ma |
| 2015/0137867 A1 | 5/2015 | Ma |

\* cited by examiner

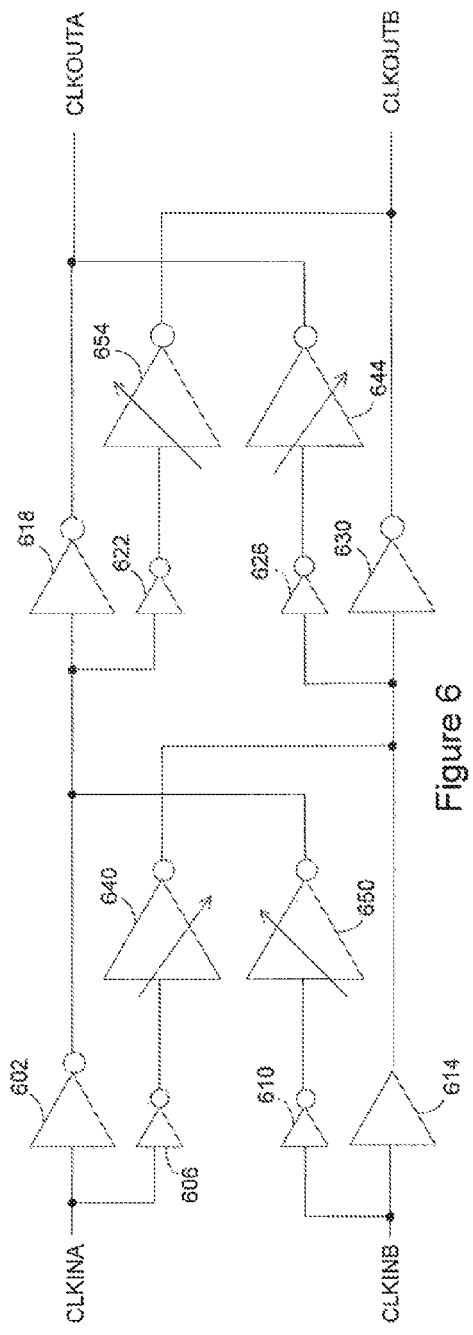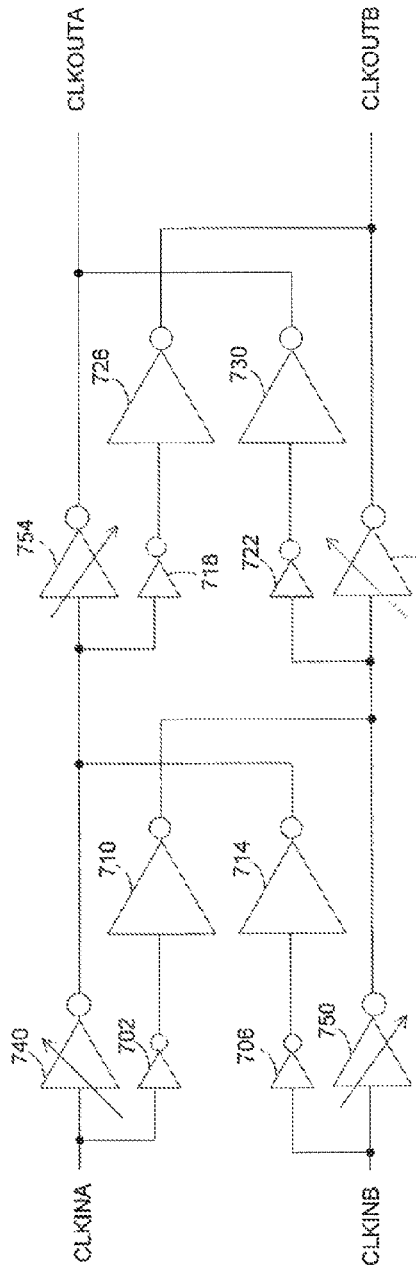

APPARATUSES AND METHODS FOR PHASE INTERPOLATING CLOCK SIGNALS AND FOR PROVIDING DUTY CYCLE CORRECTED CLOCK SIGNALS

CROSS-REFERENCE TO RELATED APPLICATION(S)

This application is a divisional of U.S. patent application Ser. No. 13/936,965 filed Jul. 8, 2013, entitled APPARATUSES AND METHODS FOR PHASE INTERPOLATING CLOCK SIGNALS AND FOR PROVIDING DUTY CYCLE CORRECTED CLOCK SIGNALS, issued as U.S. Pat. No. 9,503,066 on Nov. 22, 2016. This application is incorporated by reference herein in its entirety and for any purposes.

BACKGROUND

As system clock speeds continue to rise, signal reliability and accuracy have become increasingly important, particularly with respect to amplitude, frequency, and distortion. Providing signals with robust duty cycles has also been desirable, as many digital circuits require a precisely controlled duty cycle for proper operation. In some cases, circuits are configured to operate on both rising and falling edges of clocks, further emphasizing the importance of maintaining a consistently accurate duty cycle for a clock signal.

Known approaches for correcting duty cycle error and providing duty cycle corrected dock signals (e.g., a dock signal having a 50% duty cycle) typically utilize adjustable delay circuits that are incrementally adjusted until the duty cycle of a clock signal is corrected. The adjustable delay circuits may be repeatedly adjusted until any detectable duty cycle error in an output clock signal is eliminated. The process of correcting the duty cycle can take a relatively long time, as the iterative adjustment of the delays and duty cycle error detection can take several hundreds of clock cycles to fully correct duty cycle error. Such approaches may be unable to correct duty cycle error as quickly as may be desired. For example, operation of the circuits relying on the duty cycle corrected clock signal may not begin until the duty cycle error is corrected. As a result, several hundreds of clock cycles must elapse before any of these circuits may be operated, which can be undesirable in many applications.

BRIEF DESCRIPTION OF THE DRAWINGS

FIG. 6 is a schematic diagram of a duty cycle adjuster circuit according to an embodiment of the invention.

FIG. 7 is a schematic diagram of a duty cycle adjuster circuit according to an embodiment of the invention.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
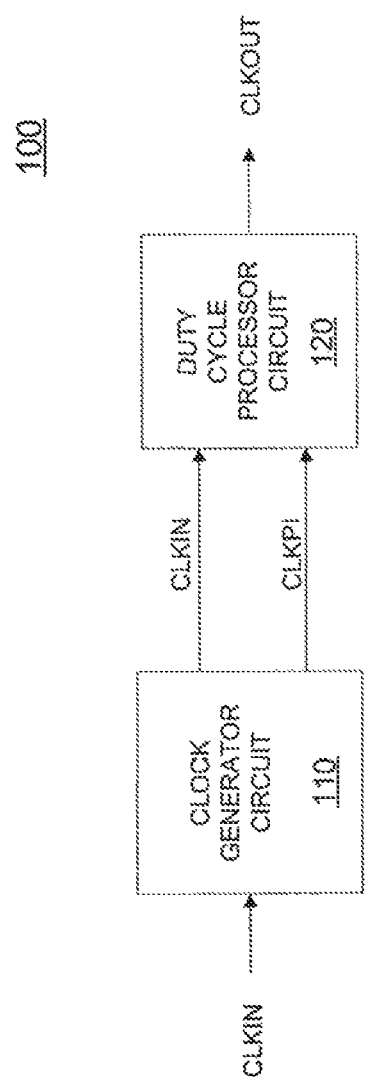
FIG. 1 is a block diagram of an apparatus including a duty cycle corrected clock signal generator circuit according to an embodiment of the invention.

FIG. 1 illustrates an apparatus including duty cycle corrected dock signal generator circuit 100 according to an embodiment of the invention. The duty cycle corrected clock signal generator circuit 100 is configured to receive an input dock signal CLKIN and provide a duty cycle corrected output clock signal CLKOUT that is based on the CLKIN signal. The CLKIN signal may have duty cycle error that is corrected by the duty cycle corrected dock signal generator circuit 100 to provide the CLKOUT signal having a corrected duty cycle (e.g., a duty cycle of approximately 50%). The duty cycle corrected clock signal generator circuit 100 includes a clock generator circuit 110 configured to receive the CLKIN signal and provide the CLKIN signal and a clock signal CLKPI that is approximately 180 degrees out of phase with CLKIN signal. The CLKIN signal and the CLKPI signal from the clock generator circuit 110 are provided to duty cycle processor circuit 120. As will be described in more detail below, the duty cycle processor circuit 120 is configured to provide the CLKOUT signal having a same frequency as the CLKIN signal and having a corrected duty cycle.

Figure 2:
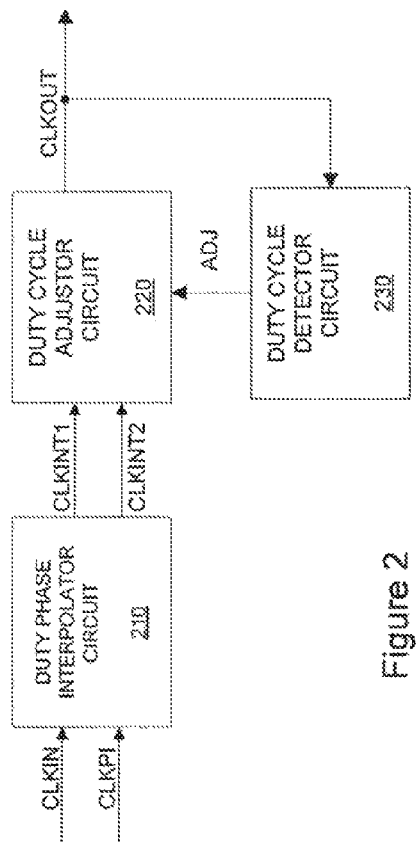
FIG. 2 is a block diagram of a duty cycle processor circuit according to an embodiment of the invention.

FIG. 2 illustrates a duty cycle processor circuit 200 according to an embodiment of the invention. The duty cycle processor circuit 200 may be included in the duty cycle processor circuit 120 of FIG. 1. The duty cycle processor circuit 200 includes a duty phase interpolator circuit 210 that is configured to receive the CLKIN and CLKPI signals and provide a first interpolated dock signal CLKINT1 that is duty cycle corrected and further provide a second interpolated clock signal CLKINT2 that is duty cycle corrected. The CLINT1 and CLKINT2 signals may be out of phase by approximately 180 degrees. For example, approximately 180 degrees may be in a range of 180 degrees plus or minus 15 degrees. In some embodiments, approximately 180 degrees may be a range limited by the capabilities of the circuitry used and/or operational conditions. Nonetheless, signals that are out of phase by more than a specific range described may still be considered out of phase by approximately 180 degrees for other embodiments. The CLKINT1 and CLKINT2 signals are provided to a duty cycle adjuster circuit 220 that is configured to further correct the duty cycle adjusted CLKINT1 and CLKINT2 signals, and provide the duty cycle corrected CLKOUT signal. The CLKOUT signal is provided to a duty cycle detector circuit 230 that is configured to detect duty cycle error (e.g., deviation from a 50% duty cycle) of the CLKOUT signal and provide adjustment signals ADJ to the duty cycle adjuster circuit 220. The duty cycle adjuster circuit 220 is configured to adjust the duty cycle of the CLKOUT signal based at least in part on the ADJ signals. In some embodiments the CLKINT1 and CLKINT2 may be coarsely duty cycle corrected clock signals, and the duty cycle adjuster circuit 220 provides fine duty cycle correction.

Figure 3:
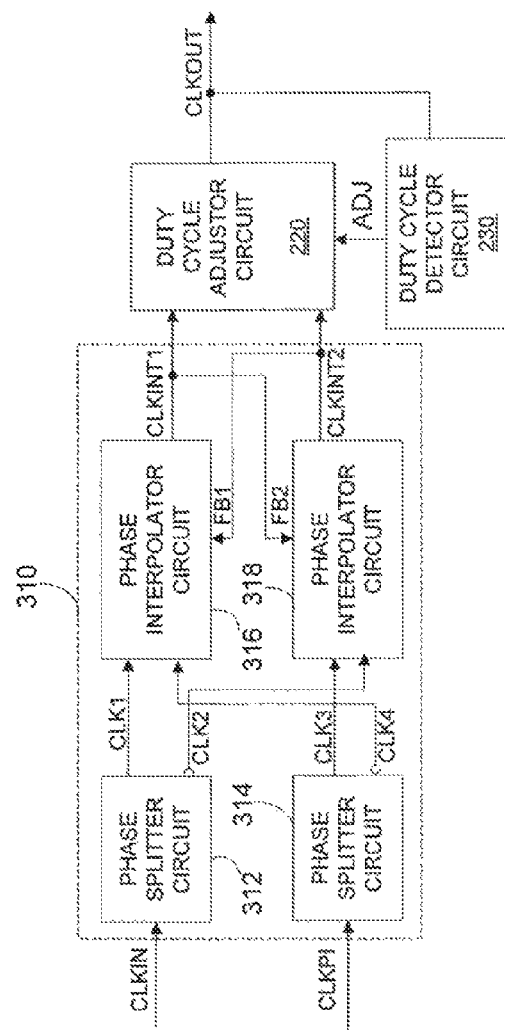
FIG. 3 is a block diagram of a duty phase interpolator circuit according to an embodiment of the invention.

FIG. 3 illustrates a duty phase interpolator circuit 310 according to an embodiment of the invention. The duty phase interpolator circuit 310 may be included in the duty phase interpolator circuit 210 of FIG. 2. The duty phase interpolator circuit 310 includes phase splitter circuits 312 and 314. The phase splitter circuit 312 is configured to receive the CLKIN signal and provide a first split clock signal CLK1 and a second split clock signal CLK2. The CLK1 and CLK2 signals are complementary. For example, the CLK1 signal is at a high clock level when the CLK2 signal is at a low clock level, and the CLK1 signal is at a low clock level when the CLK2 signal is at a high clock level. The phase splitter circuit 314 is configured to receive the CLKPI signal and provide a third split clock signal CLK3 and a fourth split clock signal CLK4, which are complementary to each other. Although not shown, in some embodiments, the phase splitter circuit 312 and 314 may include two series coupled inverters and three series coupled inverters, both of which are coupled in parallel. A true clock signal (e.g., non-inverted relative to the input clock signal) is provided by the two series coupled inverters and an inverted clock signal (e.g., inverted relative to the input clock signal) is provided by the three series coupled inverters. The propagation delay of the two series coupled inverters and the propagation delay of the three series coupled inverters may be approximately equal to avoid phase shifts of the true and inverted clock signals relative to one another.

The duty phase interpolator circuit 310 further includes phase interpolator circuits 316 and 318. The phase interpolator circuit 316 is configured to receive the CLK1 signal at a first input A and receive the CLK4 signal at a second input 13, and provide the first interpolated clock signal CLKINT1. The phase interpolator circuit 318 is configured to receive the CLK2 signal at a second input 13 and receive the CLK3 signal at first input A, and provide the second interpolated clock signal CLKINT2. Although not necessary in all embodiments of the invention, the CLKINT2 signal may be provided to the phase interpolator circuit 316 as a first feedback signal FB1 and the CLKINT1 signal may be provided to the phase interpolator circuit 318 as a second feedback signal FB2.

In operation, the phase splitter circuit 312 receives the CLKIN signal and provides the CLK1 and CLK2 signals and the phase splitter circuit 314 receives the CLKPI signal and provides the CLK3 and CLK4 signals. The phase interpolator circuit 316 interpolates (e.g., combines) the CLK1 and CLK4 signals to provide the CLKINT1 signal. By combining the CLK1 and CLK4 signals, the phase interpolator circuit 316 provides the CLKINT1 signal having a corrected duty cycle and a cycle time that is the same as the CLKIN signal. The phase interpolator circuit 318 interpolates the CLK2 and CLK3 signals to provide the CLKINT2 signal having a corrected duty cycle and a cycle time that is the same as the CLKIN signal, and which is also complementary to the CLKINT1 signal. The CLKINT1 and CLKINT2 signals are also provided to the duty cycle adjustor circuit 220, previously described with reference to FIG. 2, which provides the duty cycle corrected CLKOUT signal. As also previously described, the duty cycle adjustor circuit 220 may adjust a duty cycle of the CLKOUT signal based on the ADJ signal provided by the duty detector circuit 230. In some embodiments duty cycle adjustor circuit 220 may provide fine duty cycle correction to the CLKOUT signal.

Figure 4:
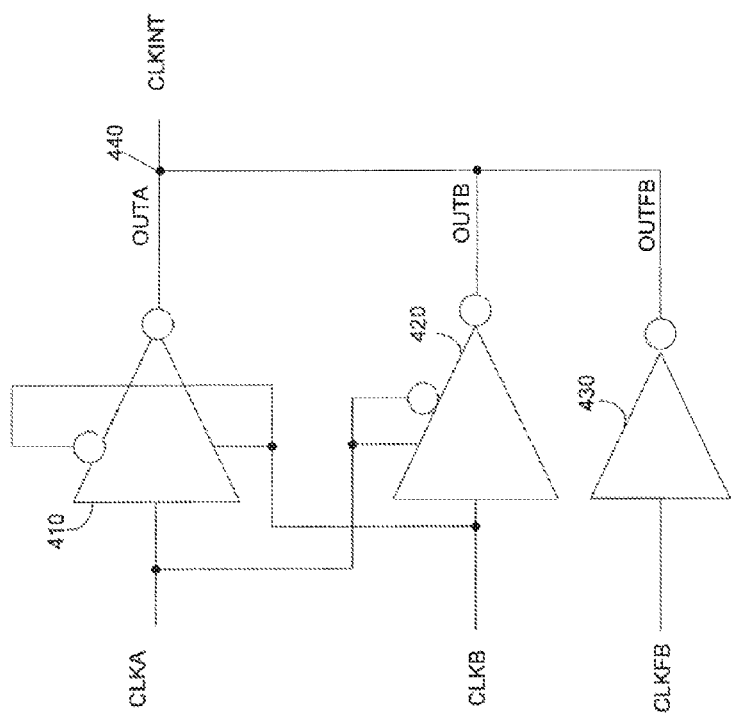
FIG. 4 is a schematic diagram of a phase interpolator circuit according to an embodiment of the invention.

FIG. 4 illustrates a phase interpolator circuit 400 according to an embodiment of the invention. The phase interpolator circuit 400 may be included in the phase interpolator circuit 316 and/or 318 of FIG. 3. As will be described in more detail below, the phase interpolator circuit 400 may be configured to interpolate first and second clock signals to provide an output clock signal at an output node. The first clock signal is provided to the output node as controlled by the second clock signal and the second clock signal is provided to the output node as controlled by the first clock signal to be interpolated and provide the output clock signal. The phase interpolator circuit 400 includes an inverter 410 and an inverter 420 coupled in parallel to an output node 440. In some embodiments, an inverter 430 may also be coupled to the output node 440. The inverter 410 is configured to provide a first output clock signal OUTA to the node 440 responsive to an input clock signal CLKA. The inverter 410 is controlled (e.g., activated/deactivated) by an input clock signal CLKB. For example, the inverter 410 does not output the OUTA signal unless controlled by the CLKB signal to do so. The inverter 420 is configured to be controlled by the CLKA signal, and to provide a second output clock signal OUTB to the node 440 responsive to the CLKB signal. The inverter 430 provides a third output clock signal OUTFB responsive to a third input clock signal CLKFB. In some embodiments, however, the inverter 430 may not be not included in a phase interpolator circuit. The phase interpolator circuit 400 is configured to interpolate the CLKA and CLKB signals to provide an interpolated clock signal CLKINT. The FLKFB signal may be an interpolated clock signal CLKINT provided by different phase interpolator circuit 400, for example, as previously discussed with reference to the phase interpolator circuits 316 and 318.

In operation, the inverter 410 is controlled by the CLKB signal to provide an inverted CLKA signal as the OUTA signal, and the inverter 420 is controlled by the CLKA signal to provide an inverted CLKB signal as the OUTB signal. The OUTA and OUTB signals are provided to the output node 440 to provide the CLKINT signal. The inverter 430, which may be included in some embodiments, is configured to provide additional drive during transitions of the CLKINT signal resulting from the OUTA and OUTB signals by providing the OUTFB signal to the node 440 responsive to the CLKFB signal. The inverter 410 may be a high-impedance (high-Z) inverter that provides a high-impedance at its output when disabled by the OUTB signal and provides an inverted CLKA signal as the OUTA signal when enabled by the OUTB signal. The inverter 420 may be an enable inverter that decouples the node 440 from a voltage supply and a voltage reference when disabled by the OUTA signal and provides an inverted CLKB signal as the OUTB signal when enabled by the OUTA signal.

Figure 5:
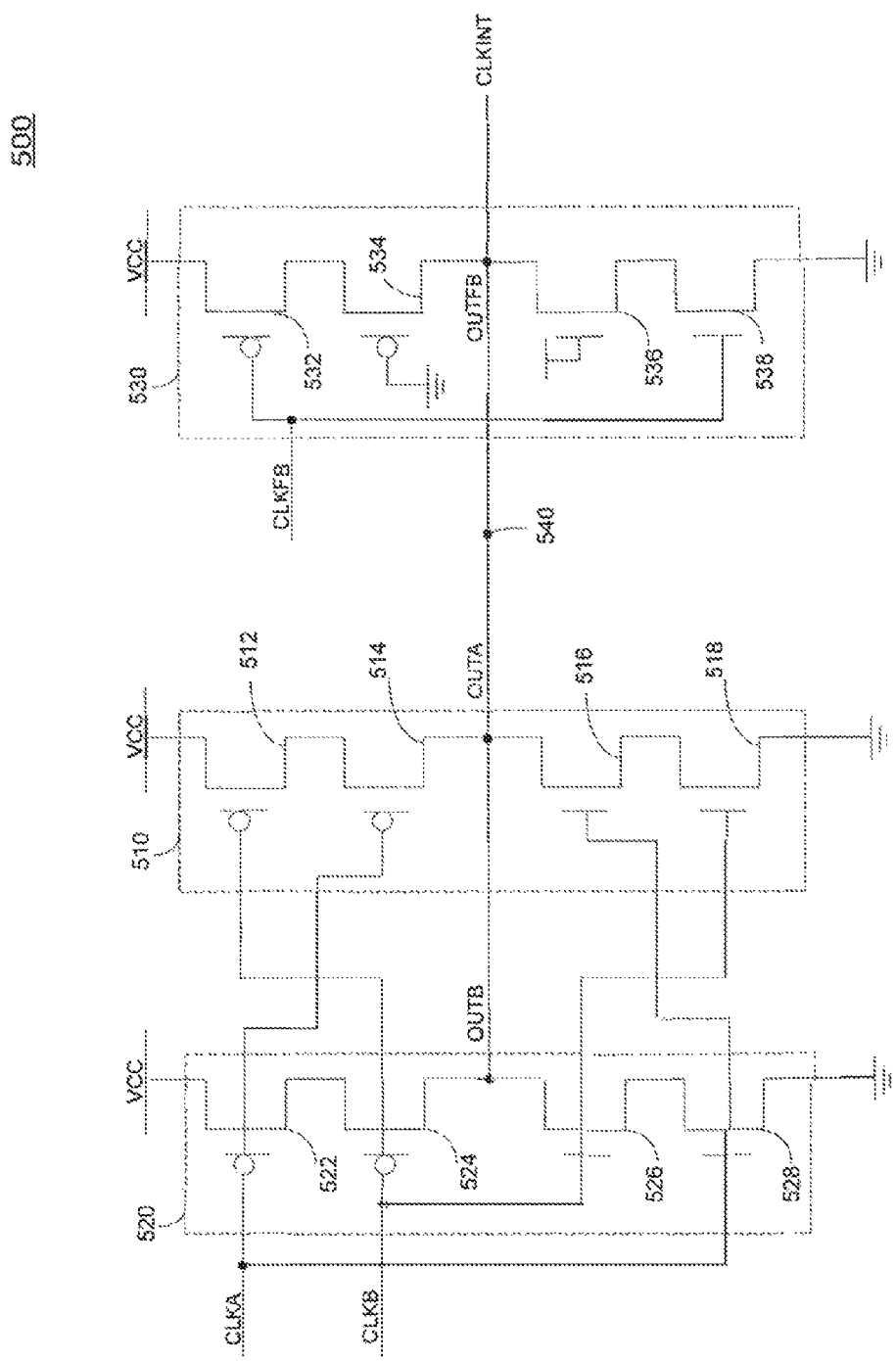
FIG. 5 is a schematic diagram of a phase interpolator circuit according to an embodiment of the invention.

FIG. 5 illustrates a phase interpolator circuit 500 according to an embodiment of the invention. The phase interpolator circuit 500 may be included in the phase interpolator circuit 316 and/or 318 of FIG. 3. The phase interpolator circuit 500 includes an inverter 510 and an inverter 520. The inverter 510 includes transistors 512, 514, 516, and 518. The transistor 512 is configured to be coupled to a voltage supply and the transistor 518 is configured to be coupled to a voltage reference (e.g., ground). In some embodiments, the voltage supply provides a supply voltage VCC. The transistor 514 is coupled to the transistor 512 and an output node 540, and the transistor 516 is coupled to the transistor 518 and the output node 540. The transistors 514 and 516 are configured to be activated/deactivated (e.g., made conductive/non-conductive) to pull up and pull down, respectively, the output node 540 responsive to an input clock signal CLKA. The transistors 512 and 518 are configured to be activated/deactivated to couple the transistor 514 to the voltage supply and couple the transistor 516 to the voltage reference responsive to an input clock signal CLKB. The inverter 510 provides an output clock signal OUTA to the output node 540 responsive to the CLKA signal, as controlled by the CLKB signal.

The inverter 520 includes transistors 522, 524, 526, and 528. The transistor 522 is configured to be coupled to a voltage supply and the transistor 528 is configured to be coupled to a voltage reference. The transistor 524 is coupled to the transistor 522 and the output node 540, and the transistor 526 is coupled to the transistor 528 and the output node 540. The transistors 524 and 526 are configured to be activated/deactivated to pull up and pull down, respectively, the output node 540 responsive to the CLKB signal. The transistors 522 and 528 are configured to be activated/deactivated to couple the transistor 524 to the voltage supply and couple the transistor 526 to the voltage reference responsive to the CLKA signal. The inverter 520 provides an output clock signal OUTB to the output node 540 responsive to the CLKB signal, as controlled by the CLKA signal.

In some embodiments of a phase interpolator circuit, an inverter 530 may be further included, for example, as shown for the embodiment illustrated by FIG. 5. However, the inverter 530 is not required. The inverter 530 includes transistors 532, 534, 536, and 538. The transistor 532 is configured to be coupled to a voltage supply and the transistor 538 is configured to be coupled to a voltage reference. The transistor 534 is coupled to the transistor 532 and the output node 540, and the transistor 536 is coupled to the transistor 538 and the output node 540. The transistors 532 and 538 are configured to be activated/deactivated responsive to an input clock signal CLKFB. The transistor 534 is coupled to the voltage reference to be activated and the transistor 536 is coupled to the voltage supply to be activated. The inverter 530 provides an output clock signal OUTFB to the output node 540 responsive to the CLKFB signal.

Including the inverter 510 and the inverter 520 in the arrangement shown in FIG. 5 may provide balanced drive strength and symmetrical phase information retention during floating time, for example, when both the inverter 540 and 520 are disabled by the CLKB and CLKA signals, respectively. That is, the CLKA signal is provided to transistors 514 and 516 of the inverter 510, which are coupled to the node 540, and the CLKA signal is further provided to transistors 522 and 528 of the inverter 520, which are coupled to the voltage supply and voltage reference, respectively. Likewise, the CLKB signal is provided to transistors 524 and 526 of the inverter 520, which are coupled to the node 540, and the CLKB signal is further provided to transistors 512 and 518 of the inverter 510, which are coupled to the voltage supply and voltage reference, respectively. Thus, both CLKA and CLKB are used to activate an inverter, as well as provide an input to another inverter.

In the embodiment of FIG. 5, the transistors 512, 514, 522, 524, 532, and 534 are illustrated as p-channel field effect transistors (pFETs), and the transistors 516, 518, 526, 528, 536, and 538 are illustrated as n-channel field effect transistors (nFETs). In other embodiments, the transistors of the inverter 510, 520, and 530 may be different types of transistors known in the art.

In operation, when both the CLKA and CLKB signals have high clock levels the inverter 510 couples the output node 540 to the voltage reference to provide a low clock level OUTA signal, and when both the CLKA and CLKB signal have low clock levels the inverter 510 couples the output node 540 to the voltage supply to provide a high clock level OUTA signal. Likewise, when both the CLKA and CLKB signals have high clock levels the inverter 520 couples the output node 540 to the voltage reference to provide a low clock level OUTB signal, and when both the CLKA and CLKB signal have low clock levels the inverter 520 couples the output node 540 to the voltage supply to provide a high clock level OUTS signal. In an example where the CLKA and CLKB signals have the same clock cycle, and are complementary and approximately 180 degrees out of phase relative to one another (e.g., CLK1 and CLK4, and CLK2 and CLK3 of FIG. 3), the resulting CLKINT signal may have the same clock cycle as the CLKA and CLKB signals, and a fifty percent duty cycle. Such a condition may exist when the phase interpolator circuit 500 is included in the phase interpolator circuits 316 and 318 of the duty phase interpolator circuit 310, and the phase interpolator circuits 316 is provided with the CLK1 and CLK4 signals and the phase interpolator circuits 318 is provided with the CLK2 and CLK3 signals.

When included, the inverter 530 couples the output node 540 to the voltage reference responsive to a high clock level CLKFB signal, and further couples the output node 540 to the voltage supply responsive to a low clock level CLKFB signal. Responsive to the CLKFB signal, the OUTFB signal provided to the output node 440 by the inverter 530 may provide additional drive during transitions of the CLKINT signal resulting from the OUTA and OUTB signals. In an example wherein the CLKFB signal is a signal that complementary to the CLKINT signal, the resulting OUTFB signal may provide additional drive to reinforce the CLKINT signal. Such a condition may exist when the inverter 530 is included in the phase interpolator circuits 316 and 318 of the duty phase interpolator circuit 310, and the phase interpolator circuit 316 is provided with the CLKINT2 signal as the FB1 signal and the phase interpolator circuit 318 is provided with the CLKINT1 signal as the FB2 signal.

FIG. 6 illustrates a duty cycle adjuster circuit 600 according to an embodiment of the invention. The duty cycle adjuster circuit 600 may be used to implement the duty cycle adjuster circuit 220 of FIG. 2 and FIG. 3. The duty cycle adjuster circuit 600 includes inverters 602 and 606 configured to receive an input clock signal CLKINA, and further includes inverters 610 and 614 configured to receive an input clock signal CLKINB. An output of the inverter 602 is coupled to inputs of inverters 618 and 622, and an output of the inverter 614 is coupled to inputs of inverters 626 and 630.

The duty cycle adjuster 600 further includes adjustable inverter drivers 640, 644, 650, and 654. An adjustable inverter driver may be adjusted to change a timing of an input signal and provide a resulting output signal. For example, the adjustable inverter driver 640 may be adjusted to change the timing of an input signal provided by the inverter 606 to provide an output signal to an input to the inverters 626 and 630. In some embodiments, the adjustable inverter drivers 640, 644, 650, and 654 are configured to have respective drive strengths adjusted to change the timing of an input signal. That is, the time for a clock signal to transition from a low clock level to a high clock level (e.g., a rising clock edge) and/or from a high clock level to a low clock level (e.g., a falling clock edge) may be changed, which in turn may adjust the timing of the clock signal. The adjustable inverter drivers 640, 644, 650, and 654 may be adjusted, for example, based at least in part on control signals (not shown in FIG. 6) provided to each of the adjustable inverter drivers. In some embodiments the adjustable inverter drivers 640, 644, 650, and 654 may be configured to be adjusted based on respective bias signals. In some embodiments, the adjustable inverter drivers 640, 644, 650, and 654 may be adjusted based on digital control signals. As represented by the orientation of arrows, the adjustable inverter drivers 640 and 644 are adjusted in a similar manner, and the adjustable inverter drivers 650 and 654 are adjusted in a similar manner. For example, when the adjustable inverter driver 640 is adjusted to increase drive strength to reduce falling clock edge and/or rising clock edge transition time, the adjustable inverter driver 644 may be likewise adjusted to increase drive strength and reduce failing clock edge and/or rising clock edge transition time. Similarly, when the adjustable inverter driver 640 is adjusted to decrease drive strength to increase falling clock edge and/or rising clock edge transition time, the adjustable inverter driver 644 may be likewise adjusted to decrease drive strength and increase falling clock edge and/or rising clock edge transition time.

In operation, the duty cycle adjuster circuit 600 is configured to adjust the duty cycle of the CLKINA and CLKINB signals to provide duty cycle adjusted clock signals CLKOUTA and CLKOUTB. One or both of the CLKOUTA and CLKOUTB signals may be provided as a duty cycle corrected output clock signal (e.g., the CLKOUT signal) that is based on the CLKIN signal. The duty cycle of the CLKINA signal is adjusted at least in part by adjusting the adjustable inverter drivers 640 and 644 in the clock path through inverter 606, adjustable inverter driver 640, inverter 626, and adjustable inverter driver 644. The output signal of the adjustable inverter driver 644 is combined with the output signal of inverter 618 to provide the CLKOUTA signal. The duty cycle of the CLKINB signal is adjusted at least in part by adjusting the adjustable inverter drivers 650 and 654 in the clock path through inverter 610, adjustable inverter driver 650, inverter 622, and adjustable inverter driver 654. The output signal of the adjustable inverter driver 654 is combined with the output signal of inverter 630 to provide the CLKOUTB signal. Propagation of the CLKINA and CLKIN signals through the clock paths may adjust the transition times of the respective clock signals between high and low clock levels, which may result in CLKOUTA and CLKOUTB signals having adjusted duty cycles.

FIG. 7 illustrates a duty cycle adjuster circuit 700 according to an embodiment of the invention. The duty cycle adjuster circuit 700 may be used to implement the duty cycle adjuster circuit 220 of FIG. 2 and FIG. 3. The duty cycle adjuster circuit 700 includes inverter 702 configured to receive an input clock signal CLKINA and inverter 710 coupled to an output of the inverter 702. An inverter 706 is configured to receive an input clock signal CLKINB and inverter 714 is coupled to an output of the inverter 706. The duty cycle adjuster circuit 700 further includes inverters 718 and 726 coupled in series from an output of the inverter 714, and inverters 722 and 730 coupled in series from an output of the inverter 710. Adjustable inverter driver 740 is configured to receive the CLKINA signal and is coupled to adjustable inverter driver 754. Adjustable inverter driver 745 is configured to receive the CLKINB signal and is coupled to adjustable inverter driver 744.

The adjustable inverter drivers 740, 744, 750, and 754 may be adjusted to change a timing of the CLKINA and CLKINB signals to provide output clock signals CLKOUTA and CLKOUTB. In some embodiments, the adjustable inverter drivers 740, 744, 750, and 754 are configured to have respective drive strengths adjusted to change the timing of an input signal. For example, the transition time for a rising clock edge and/or the transition time for a falling clock edge may be changed by adjusting the drive strengths. The adjustable inverter drivers 740, 744, 750, and 754 may be adjusted based at least in part on control signals (not shown in FIG. 7) provided to each of the adjustable inverter drivers. In some embodiments the adjustable inverter drivers 740, 744, 750, and 754 may be configured to be adjusted based on respective bias signals. In some embodiments, the adjustable inverter drivers 740, 744, 750, and 754 may be adjusted based on digital control signals. As represented by the orientation of arrows, the adjustable inverter drivers 740 and 744 are adjusted in a similar manner, and the adjustable inverter drivers 750 and 754 are adjusted in a similar manner. For example, when the adjustable inverter driver 740 is adjusted to increase drive strength to reduce falling clock edge and/or rising clock edge transition time, the adjustable inverter driver 744 may be likewise adjusted to increase drive strength and reduce falling clock edge and/or rising clock edge transition time. Similarly, when the adjustable inverter driver 740 is adjusted to decrease drive strength to increase falling clock edge and/or rising clock edge transition time, the adjustable inverter driver 744 may be likewise adjusted to decrease drive strength and increase falling clock edge and/or rising clock edge transition time.

In operation, the duty cycle adjuster circuit 700 is configured to adjust the duty cycle of the CLKINA and CLKINB signals to provide duty cycle adjusted clock signals CLKOUTA and CLKOUTB. One or both of the CLKOUTA and CLKOUTB signals may be provided as a duty cycle corrected output clock signal that is based on the CLKIN signal (e.g., the CLKOUT signal). Output signals provided by the adjustable inverter driver 754 and the inverter 730 are combined to provide the CLKOUTA signal, and output signals provided by the adjustable inverter driver 744 and the inverter 726 are combined to provide the CLKOUTB signal. Propagation of the CLKINA and CLKBIN signals through the clock paths of the duty cycle adjuster circuit 700 may adjust the transition times of the respective clock signals between high and low clock levels, which may result in CLKOUTA and CLKOUTB signals having adjusted duty cycles.

Figure 8:
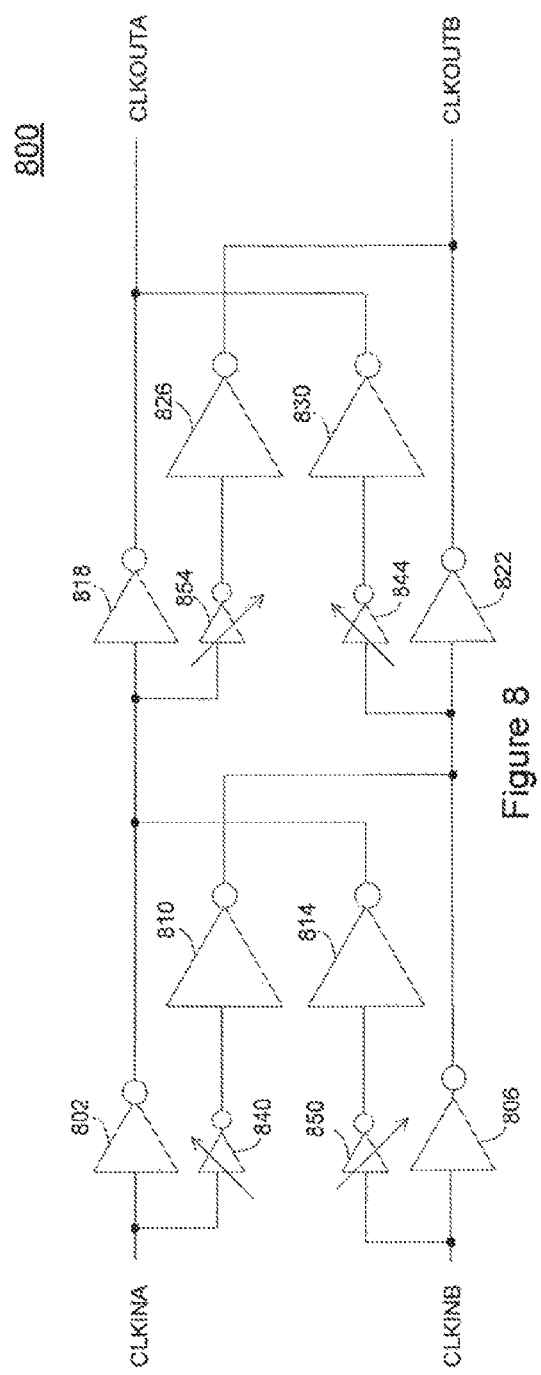
FIG. 8 is a schematic diagram of a duty cycle adjuster circuit according to an embodiment of the invention.

FIG. 8 illustrates a duty cycle adjuster circuit 800 according to an embodiment of the invention. The duty cycle adjuster circuit 800 may be used to implement the duty cycle adjuster circuit 220 of FIG. 2 and FIG. 3. The duty cycle adjuster circuit 800 includes inverter 802 configured to receive an input clock signal CLKINA and provide an output signal to inverter 818, and further includes inverter 806 configured to receive an input clock signal CLKINB and provide an output signal to inverter 822. Adjustable inverter driver 840 is configured to receive the CLKINA signal and is coupled to inverter 810, and adjustable inverter driver 850 is configured to receive the CLKINB signal and is coupled to inverter 814. Adjustable inverter driver 854 is coupled to the inverter 802 and provides an output signal to inverter 826, and adjustable inverter driver 854 is coupled to the inverter 806 and provides an output signal to inverter 830.

The adjustable inverter drivers 840, 844, 850, and 854 may be adjusted to change a timing of the CLKINA and CLKINB signals to provide output clock signals CLKOUTA and CLKOUTB. In some embodiments, the adjustable inverter drivers 840, 844, 850, and 854 are configured to have respective drive strengths adjusted to change the timing of an input signal. For example, the transition time for a rising clock edge and/or the transition time for a falling clock edge may be changed by adjusting the drive strengths. The adjustable inverter drivers 840, 844, 850, and 854 may be adjusted based at least in part on control signals (not shown in FIG. 8) provided to each of the adjustable inverter drivers. In some embodiments the adjustable inverter drivers 840, 844, 850, and 854 may be configured to be adjusted based on respective bias signals. In some embodiments, the adjustable inverter drivers 840, 844, 850, and 854 may be adjusted based on digital control signals. As represented by the orientation of arrows, the adjustable inverter drivers 840 and 844 are adjusted in a similar manner, and the adjustable inverter drivers 850 and 854 are adjusted in a similar manner. For example, when the adjustable inverter driver 840 is adjusted to increase drive strength to reduce falling clock edge and/or rising clock edge transition time, the adjustable inverter driver 844 may be likewise adjusted to increase drive strength and reduce falling clock edge and/or rising clock edge transition time. Similarly, when the adjustable inverter driver 840 is adjusted to decrease drive strength to increase falling clock edge and/or rising clock edge transition time, the adjustable inverter driver 844 may be likewise adjusted to decrease drive strength and increase falling clock edge and/or rising clock edge transition time.

In operation, the duty cycle adjuster circuit 800 is configured to adjust the duty cycle of the CLKINA and CLKINB signals to provide duty cycle adjusted clock signals CLKOUTA and CLKOUTB. One or both of the CLKOUTA and CLKOUTB signals may be provided as a duty cycle corrected output clock signal that is based on the CLKIN signal (e.g., the CLKOUT signal). Output signals provided by the inverter 818 and the inverter 830 are combined to provide the CLKOUTA signal, and output signals provided by the inverter 822 and the inverter 826 are combined to provide the CLKOUTB signal. The adjustable inverter drivers 840, 844, 850, and 854 may be adjusted to change the timing of the CLKINA and CLKINB signals as they propagate through the clock paths of the duty cycle adjuster circuit 800, for example, by adjusting the transition times of the respective clock signals between high and low clock levels, which may result in CLKOUTA and CLKOUTB signals having adjusted duty cycles.

Figure 9:
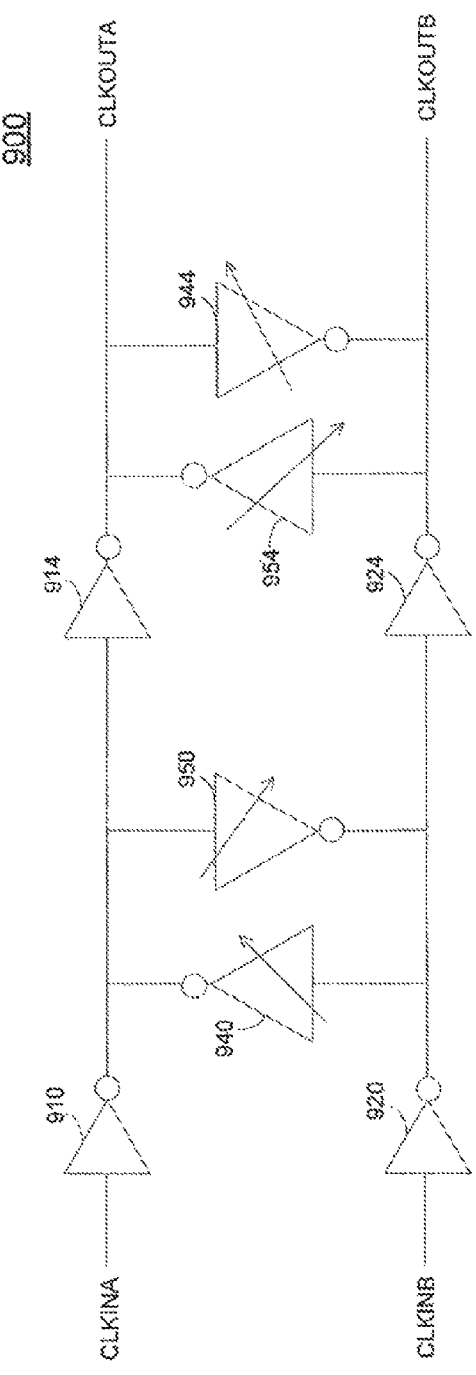
FIG. 9 is a schematic diagram of a duty cycle adjuster circuit according to an embodiment of the invention.

FIG. 9 illustrates a duty cycle adjuster circuit 900 according to an embodiment of the invention. The duty cycle adjuster circuit 900 may be used to implement the duty cycle adjuster circuit 220 of FIG. 2 and FIG. 3. The duty cycle adjuster circuit 900 includes inverter 910 configured to receive an input clock signal CLKINA and provide an output signal to inverter 914. An inverter 920 is configured to receive an input clock signal CLKINB and provide an output signal to inverter 924. The duty cycle adjuster circuit 700 includes adjustable inverter drivers 940 and 950 coupled to the inverters 910 and 920, and further includes adjustable inverter drivers 944 and 954 coupled to the inverters 914 and 924.

The adjustable inverter drivers 940, 944, 950, and 954 may be adjusted to change a timing of the CLKINA and CLKINB signals to provide output clock signals CLKOUTA and CLKOUTB. In some embodiments, the adjustable inverter drivers 940, 944, 950, and 954 are configured to have respective drive strengths adjusted to change the timing of an input signal. For example, the transition time for a rising clock edge and/or the transition time for a falling clock edge may be changed by adjusting the drive strengths. The adjustable inverter drivers 940, 944, 950, and 954 may be adjusted based at least in part on control signals (not shown in FIG. 9) provided to each of the adjustable inverter drivers. In some embodiments the adjustable inverter drivers 940, 944, 950, and 954 may be configured to be adjusted based on respective bias signals. In some embodiments, the adjustable inverter drivers 940, 944, 950, and 954 may be adjusted based on digital control signals. As represented by the orientation of arrows, the adjustable inverter drivers 940 and 944 are adjusted in a similar manner, and the adjustable inverter drivers 950 and 954 are adjusted in a similar manner. For example, when the adjustable inverter driver 940 is adjusted to increase drive strength to reduce falling clock edge and/or rising clock edge transition time, the adjustable inverter driver 944 may be likewise adjusted to increase drive strength and reduce falling clock edge and/or rising clock edge transition time. Similarly, when the adjustable inverter driver 940 is adjusted to decrease drive strength to increase falling clock edge and/or rising clock edge transition time, the adjustable inverter driver 944 may be likewise adjusted to decrease drive strength and increase falling clock edge and/or rising clock edge transition time.

In operation, the duty cycle adjuster circuit 900 is configured to adjust the duty cycle of the CLKINA and CLKINB signals to provide duty cycle adjusted clock signals CLKOUTA and CLKOUTB. One or both oldie CLKOUTA and CLKOUTB signals may be provided as a duty cycle corrected output clock signal that is based on the CLKIN signal (e.g., the CLKOUT signal). Output signals provided by the adjustable inverter driver 954 and the inverter 914 are combined to provide the CLKOUTA signal, and output signals provided by the adjustable inverter driver 944 and the inverter 924 are combined to provide the CLKOUTB signal. Propagation of the CLKINA and CLKBIN signals through the clock paths of the duty cycle adjuster circuit 900 may adjust the transition times of the respective clock signals between high and low clock levels, which may result in CLKOUTA and CLKOUTB signals having adjusted duty cycles.

In some embodiments, the CLKINA and CLKINB signals may be out of phase relative to one another by approximately 180 degrees. In some embodiments the CLKINA and CLKINB signals may be coarsely duty cycle corrected dock signals, and the duty cycle adjuster circuits 600, 700, 800, and 900 provide fine duty cycle correction.

As previously discussed, the clock generator circuit 110 is configured to receive an put clock signal CLKIN and provide the CLKIN signal and a dock signal CLKPI that is proximately 180 degrees out of phase with CLKIN signal.

Figure 10:
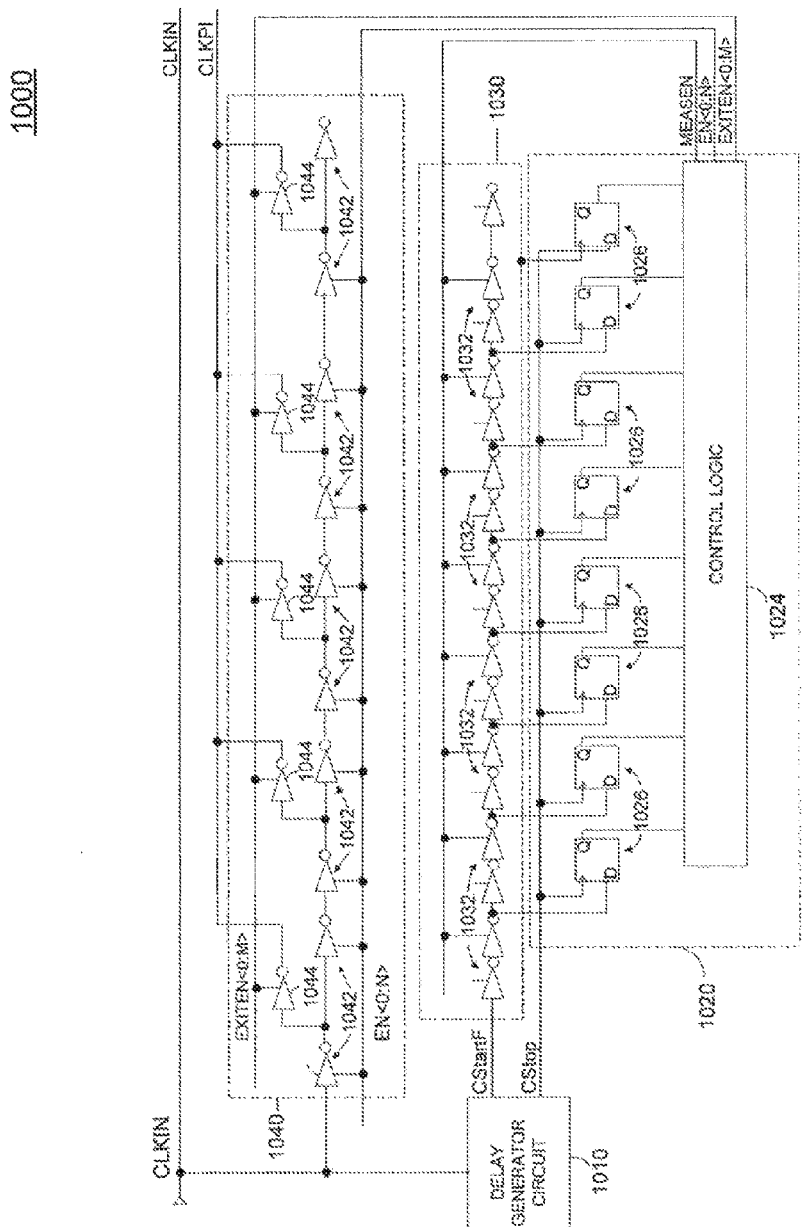
FIG. 10 is a schematic diagram of a clock generator circuit according to an embodiment of the invention.

FIG. 10 illustrates a clock generator circuit 1000 according to an embodiment of the invention. The dock generator circuit 1000 may be included in the clock generator circuit 110 of FIG. 1. The clock generator circuit 1000 includes a delay line 1030 and a delay line 1040. The delay line 1030 includes delay stages 1032 coupled in series. Each delay stage 1032 includes a pair of inverters, and provides a first unit delay to an input clock signal CSTARTF that propagates through the delay stages. The delay line 1040 includes delay stages 1042 coupled in series. Each delay stage 1042 includes an inverter, and provides a second unit delay to an input clock signal CLKIN that propagates through the delay stages. The delay stages 1042 are activated responsive to a control signal EN. The delay line 1040 further includes tap circuits 1044 coupled to the delay stages 1042. When activated by a control signal (as represented by control signal EXITEN), a respective tap circuit 1044 is configured to output the CLKIN signal as it propagates through the delay stages 1042 to provide an output clock signal CLKPI. In some embodiments, the second unit delay is one-half of the first unit delay. That is, a delay stage 1042 provides half the delay of a delay stage 1032. The inverter included in the delay stages 1042 may have a similar propagation delay as the inverter included in the delay stages 1032. As a result of each delay stage 1032 having pairs of series coupled inverters, the second unit delay provided by a delay stage 1042 is naturally one-half of the first unit delay provided by a delay stage 1032.

The clock generator circuit 1000 further includes a delay generator circuit 1010 and a delay control logic circuit 1020. The delay generator circuit 1010 is configured to provide a start signal CSTARTF to the delay line 1030 and a stop signal CSTOP to the delay control logic circuit 1020 for measurement of one clock cycle of the CLKIN signal. The delay control logic circuit 1020 is configured to provide control signal MEASEN to activate the delay line 1030, and determine a number of delay stages 1032 through which the CSTARTF signal propagates responsive to the CSTOP signal. Based on the determination, the delay control logic circuit 1020 provides the EXITEN signal and the EN signal to the delay line 1040 to activate a tap circuit 1044 and the delay stages 1042 to provide the CLKPI signal. A portion of the delay control logic circuit 1020 is shown in greater detail in FIG. 10, in particular, the delay control logic circuit 1020 includes delay stage logic 1026 and control logic 1024. Each delay stage logic 1026 is configured to receive the CSTOP signal and coupled to an output of a respective delay stage 1032. The delay stage logic 1026 is represented in the embodiment of FIG. 10 as D flip-flops. The control logic 1024 is coupled to the output of the delay stage logic 1026 and is configured to provide the MEASEN signal to enable measurement, and provide the EXITEN signal and the EN signal to the delay line 1040 based on the determined number of delay stages 1032 for one clock cycle of the CLKIN signal. As illustrated in FIG. 10, the EXITEN signal may include several individual signals (e.g., EXITEN<0:M> including M+1 signals), each signal activating a respective tap circuit 1044. The EN signal may also include several individual signals (e.g., EN<0:N> including N+1 signals), each signal activating a respective delay stage 1042.

In operation, the delay control logic circuit 1020 provides an active MEASEN signal to activate the delay circuit 1030 for measurement. An active CSTARTF signal is provided by the delay generator circuit 1010 to the delay line 1030, which propagates through the delay stages 1032. The delay generator circuit 1010 then provides an active CSTOP signal to the delay control logic circuit 1020 to determine through which delay stages 1032 the active CSTARTF signal has propagated. The CSTOP signal causes the delay stage logic 1036 to sample the logic state at the output of the respective delay stage 1032. Based on the logic states sampled, the delay control logic 1020 may determine a number of delay stages 1032 through which the active CSTARTF signal has propagated lore the CSTOP signal is received, and further provide the EXITEN signal representing the number determined. The EXITEN signal activates one of the tap circuits 1044 of the delay line 1040 to output the CLKIN signal delayed by one or more of the delay stages 1042 as the CLKSPI signal.

In some embodiments, the active CSTARTF signal may be based on a rising clock edge of the CLKIN signal, and the CSTOP signal may be based on a next rising edge of the CLKIN signal. In such an embodiment, the delay control logic 1020 effectively measures one clock cycle of the CLKIN signal, as represented by a number of delay stages 1032 through which the CLKIN signal propagates between an active CSTARTF signal and an active CSTOP signal. Where the delay stages 1042 are one-half of the delay of the delay stages 1032, the number of delay stages represented by the EXITEN signals, which activates one of the tap circuits 1044, will result in a CLKPI signal that is out of phase live to the CLKIN signal by one-half of the clock cycle of the CLKIN signal. That is, the resulting CLKPI signal may be of phase relative to the CLKIN signal by approximately 180 degrees.

Figure 11:
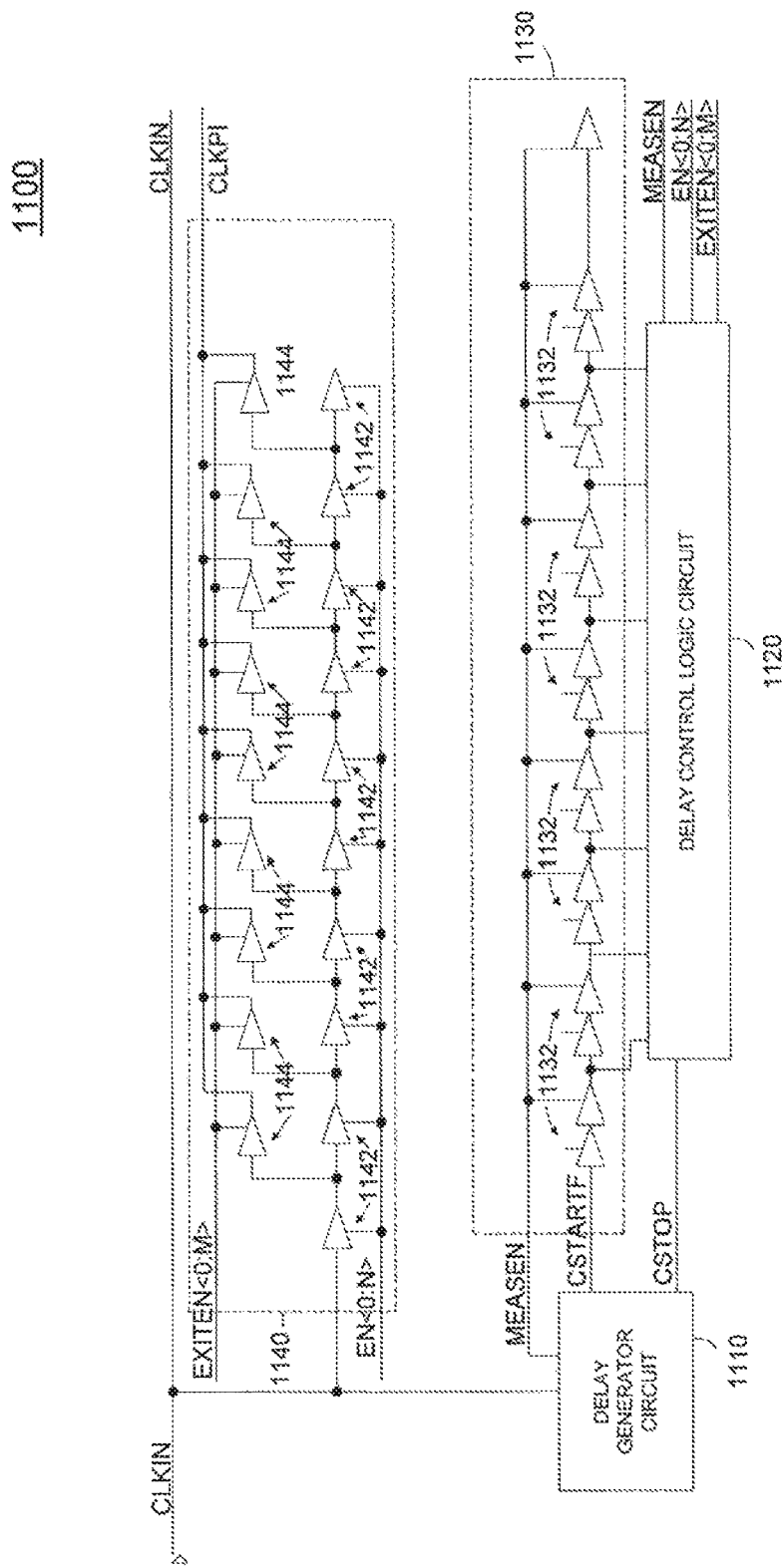
FIG. 11 is a schematic diagram of a clock generator circuit according to an embodiment of the invention.

Although shown in FIG. 10 as including inverters, the delay stages 1032 and 1042 may instead include other circuits to provide unit delays, for example, buffer circuits, logic gates, capacitive delay circuits, as well as other circuits. For example, FIG. 11 illustrates a clock generator circuit 1100 according to an embodiment of the invention.

The clock generator circuit 1100 includes a delay line 1130 that includes delay stages 1132, and further includes a delay line 1140 that includes delay stages 1142. The delay stages 1132 may be activated by a control signal MEASEN, and the delay stages 1142 may be activated by a control signal EN. The delay line 1140 further includes tap circuits 1144 coupled to outputs of the delay stages 1142, and are configured to provide a respective input signal as the CLKPI signal when activated. The tap circuits 1144 may be activated by control signal EXITEN. The delay stages 1132 of the delay line 1130 include pairs of buffer circuits, in contrast to the delay stages 1032 of FIG. 10. Similarly, the delay stages 1142 of the delay line 1140 each include a buffer circuit. In some embodiments, the buffer circuits of the delay stages 1032 and 1042 have similar delays, and as a result, the delay stages 1142 have one-half the unit delay of the delay stages 1132.

The clock generator circuit 1100 further includes a delay generator circuit 1110 and a delay control logic circuit 1120. The delay generator circuit 1110 is configured to provide a start signal CSTARTF to the delay line 1130 and a stop signal CSTOP to the delay control logic circuit 1120 for measurement of one clock cycle of the CLKIN signal. The delay control logic circuit 1120 is configured to provide the MEASEN signal to activate the delay line 1130, and determine a number of delay stages 1132 through which the CSTARTF signal propagates responsive to the CSTOP signal. Based on the determination, the delay control logic circuit 1120 provides the EXITEN signal and the EN signal to the delay line 1140 to activate a tap circuit 1144 and the delay stages 1142 to provide the CLKPI signal. As illustrated in FIG. 11, the EXITEN signal may include several individual signals (e.g., EXITEN<0:M> including M+1 signals), each signal activating a respective tap circuit 1044. The EN signal may also include several individual signals (e.g., EN<0:N> including N+1 signals), each signal activating a respective delay stage 1042. Operation of the clock generator circuit 1100 is similar to that previously described for the clock generator circuit 1000 of FIG. 10, and will not be repeated in the interest of brevity.

Generally, the clock generators 1000 and 1100 are configured to provide the CLKIN and CLKPI signals by determining a clock cycle of the CLKIN input clock signal in terms of delay and then delaying the CLKIN signal by half of the delay to provide the CLKPI signal. The clock generator circuits 1000 and 1100 may be used when Mere is a desire to provide the CLKPI signal relatively quickly. After one cycle of the CLKIN signal to determine a number of delay stages, the second delay line may be then set to provide delay to the CLKIN signal to provide the CLKPI signal. In some embodiments, the clock generator circuits 1000 and 1100 may provide the CLKPI signal approximately 180 degrees out of phase of the CLKIN signal within three clock cycles of the CLKIN signal. In some embodiments, the clock generator circuits 1000 and 1100 may provide the CLKPI signal approximately 180 degrees out of phase of the CLKIN signal within two clock cycles of the CLKIN signal.

Figure 12:
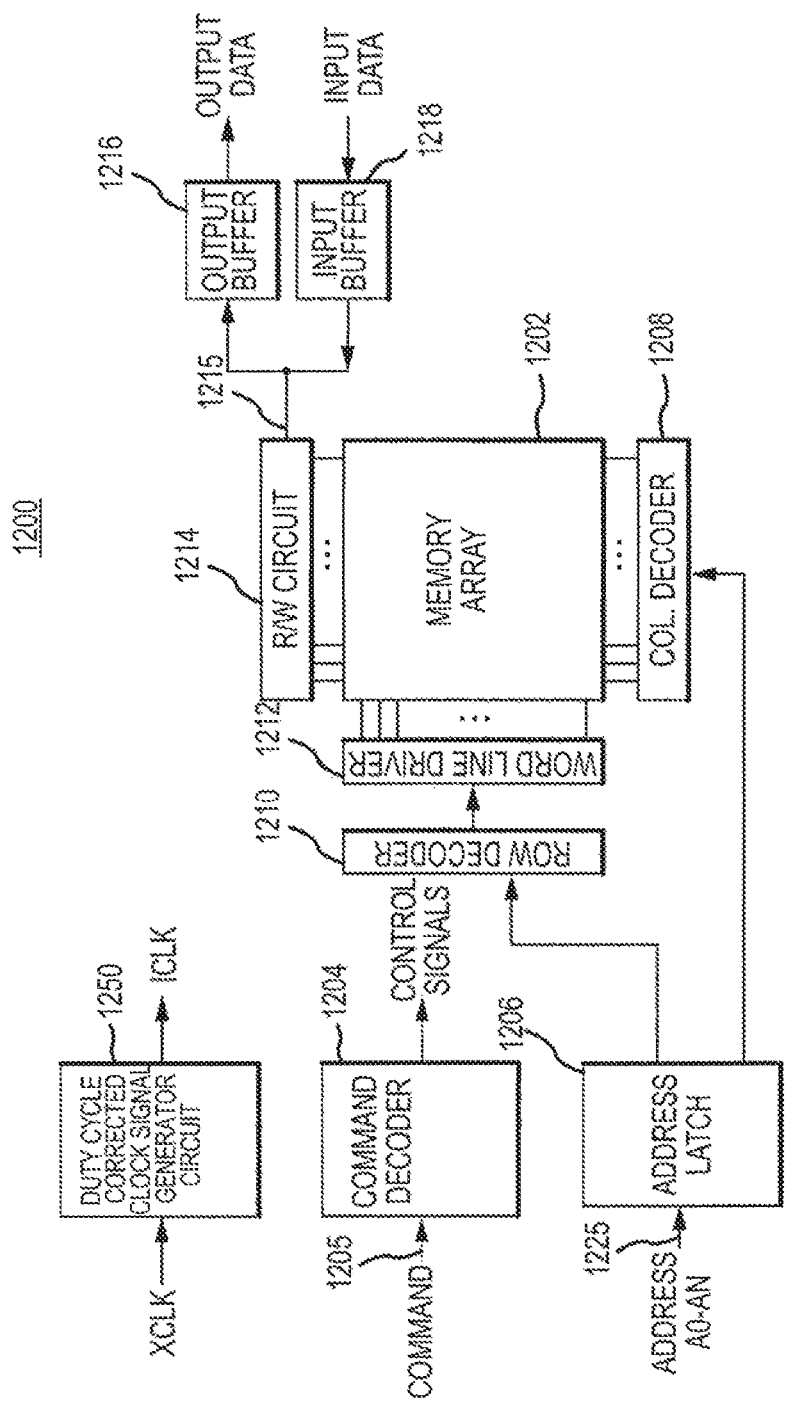
FIG. 12 is a block diagram of a memory according to an embodiment of the invention including a duty cycle corrected clock signal generator circuit according to an embodiment of the invention.

FIG. 12 is a schematic block diagram of a portion of a memory 1200 according to an embodiment of the invention. The memory 1200 includes an array 1202 of memory cells, which may be, for example, volatile memory cells, non-volatile memory cells, flash memory cells, some other types of memory cells, or combinations thereof. The memory 1200 includes an address/command decoder 1204 that receives memory commands and addresses through an ADDR/CMD bus. The address/command decoder 1204 generates control signals, based on the commands received through the ADDR/CMD bus. The address/command decoder 1204 also provides row and column addresses to the memory 1200 through an address bus and an address latch 1206. The address latch then outputs separate column addresses and separate row addresses.

The row and column addresses are provided by the address latch 1206 to a row decoder 1210 and a column decoder 1208, respectively. The column decoder 1208 selects lines extending through the array 1202 corresponding to respective column addresses. The row address decoder 1210 is connected to word line driver 1212 that activates respective rows of memory cells in the array 1202 corresponding to received row addresses. The selected line (e.g., a bit line or bit lines) corresponding to a received column address are coupled to a read/write circuitry 1214 to provide read data to an output buffer 1216 via an input-output data bus 1215. Write data are provided to the memory array 1202 through an input buffer 1218 and the memory array read/write circuitry 1214.

The memory 1200 may further include a duty cycle corrected clock signal generator 1250 according to an embodiment of the invention. For example, the duty cycle corrected clock signal generator circuit 1250 may be implemented using the apparatus 100 (FIG. 1) previously described. The duty cycle corrected clock signal generator circuit 1250 is configured to receive an external clock signal and provide a duty cycle corrected internal clock signal ICLK. The ICLK signal may be used for timing the operation of other circuits of the memory 1200. In some embodiments, the ICLK is used to generate clock signals to clock the output buffers 1216 and/or the input buffer 1218. In other embodiments, the duty cycle corrected clock signal generator circuit 1250 or other apparatuses, such as those described herein, may be used to provide duty cycle corrected clock signals for use in the memory 1200.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   a clock generator circuit configured to provide first and second clock signals responsive to an input clock signal;
   a duty phase interpolator circuit coupled to the clock generator circuit and configured to provide a first and second duty cycle corrected interpolated clock signals, the first and second duty cycle corrected interpolated clock signals approximately 180 degrees out of phase relative to one another, wherein the duty phase interpolator circuit comprises:
      a first phase splitter circuit configured to receive the first clock signal and provide a first split clock signal and a second split clock signal responsive to the first clock signal, the first and second split clock signals complementary to one another;
      a second phase splitter circuit configured to receive the second clock signal and provide a third split clock signal and a fourth split clock signal responsive to the second clock signal;
      a first phase interpolator circuit coupled to the first and second phase splitter circuits and configured to receive the first and fourth split clock signals and provide the first duty cycle corrected interpolated clock signal responsive thereto; and
      a second phase interpolator circuit coupled to the first and second phase splitter circuits and configured to receive the second and third split clock signals and provide the second duty cycle corrected interpolated clock signal responsive thereto;
   a duty cycle adjuster circuit coupled to the duty phase interpolator circuit and configured to receive the first and second duty cycle corrected interpolated clock signals and provide a duty cycle corrected clock signal responsive thereto, and further configured to adjust a duty cycle responsive to adjustment signals; and
   a duty cycle detector coupled to the duty cycle adjuster circuit and configured to detect duty cycle error of the duty cycle corrected clock signal and provide the adjustment signals to the duty cycle adjuster circuit to adjust the duty cycle to correct the duty cycle error.

2. The apparatus of claim 1 wherein the first phase interpolator is configured to receive the second duty cycle corrected interpolated clock signal and provide the first duty cycle corrected interpolated clock signal based at least in part on the second duty cycle corrected interpolated clock signal.

3. The apparatus of claim 2 wherein the second phase interpolator is configured to receive the first duty cycle corrected interpolated clock signal and provide the second duty cycle corrected interpolated clock signal based at least in part on the first duty cycle corrected interpolated clock signal.

4. An apparatus, comprising:
   a clock generator circuit configured to provide first and second clock signals responsive to an input clock signal;
   a duty phase interpolator circuit coupled to the clock generator circuit and configured to provide a first and second duty cycle corrected interpolated clock signals, the first and second duty cycle corrected interpolated clock signals approximately 180 degrees out of phase relative to one another;
   a duty cycle adjuster circuit coupled to the duty phase interpolator circuit and configured to receive the first and second duty cycle corrected interpolated clock signals and provide a duty cycle corrected clock signal responsive thereto, and further configured to adjust a duty cycle responsive to adjustment signals, wherein the duty cycle adjuster circuit comprises:

a plurality of adjustable inverter drivers, an adjustable inverter driver of the plurality of adjustable inverter drivers configured to be adjusted to change a timing of an input signal and provide an adjustable inverter driver output signal; and a plurality of inverters coupled to the plurality of adjustable inverter drivers, an inverter of the plurality of inverters configured to invert an input signal to provide an inverter output signal; and a duty cycle detector coupled to the duty cycle adjuster circuit and configured to detect duty cycle error of the duty cycle corrected clock signal and provide the adjustment signals to the duty cycle adjuster circuit to adjust the duty cycle to correct the duty cycle error.

5. The apparatus of claim 4, wherein the plurality of inverters further comprises:

a first inverter configured to receive the first duty cycle corrected interpolated clock signal and provide a first inverter output signal;

a second inverter configured to receive the first duty cycle corrected interpolated clock signal and provide a second inverter output signal;

a third inverter configured to receive the second duty cycle corrected interpolated clock signal and provide a third inverter output signal;

a fourth inverter configured to receive the second duty cycle corrected interpolated clock signal and provide a fourth inverter output signal;

a fifth inverter coupled to the first inverter and configured to provide a fifth inverter output signal;

a sixth inverter coupled to the fourth inverter and configured to provide a sixth inverter output signal;

wherein the plurality of adjustable inverter drivers further comprises:

a first adjustable inverter driver configured to receive the second inverter output signal and provide a first adjustable inverter driver output signal;

a second adjustable inverter driver configured to receive the third inverter output signal and provide a second adjustable inverter driver output signal;

a third adjustable inverter driver configured to receive the sixth inverter output signal and provide a third adjustable inverter driver output signal; and wherein the fifth inverter is configured to receive the first inverter output signal and second adjustable inverter driver output signal combined, wherein the sixth inverter is configured to receive the fourth inverter output signal and first adjustable inverter driver output signal combined, and wherein the fifth inverter output signal and third adjustable inverter driver output signal are combined to provide a first duty cycle corrected clock signal.

6. The apparatus of claim 5, wherein the plurality of inverters further comprises:

a seventh inverter configured to receive the first inverter output signal and second adjustable inverter driver output signal combined and provide a seventh inverter output signal;

an eighth inverter configured to receive the fourth inverter output signal and first adjustable inverter driver output signal combined and provide an eighth inverter output signal;

wherein the plurality of adjustable inverter drivers further comprises a fourth adjustable inverter driver configured to receive the seventh inverter output signal and provide a fourth adjustable inverter driver output signal; and wherein the eighth inverter output signal and fourth adjustable inverter driver output signal are combined to provide a second duty cycle corrected clock signal.

7. The apparatus of claim 4, wherein the plurality of inverters further comprises:

a first inverter configured to receive the first duty cycle corrected interpolated clock signal and provide a first inverter output signal;

a second inverter configured to receive the first inverter output signal and provide a second inverter output signal;

a third inverter configured to receive the second duty cycle corrected interpolated clock signal and provide a third inverter output signal;

a fourth inverter configured to receive the third inverter output signal and provide a fourth inverter output signal;

a fifth inverter coupled to the second inverter and configured to provide a fifth inverter output signal;

a sixth inverter configured to receive the fifth inverter output signal to provide a sixth inverter output signal;

wherein the plurality of adjustable inverter drivers further comprises:

a first adjustable inverter driver configured to receive the first duty cycle corrected interpolated clock signal and provide a first adjustable inverter driver output signal;

a second adjustable inverter driver configured to receive the second duty cycle corrected interpolated clock signal and provide a second adjustable inverter driver output signal;

a third adjustable inverter driver configured to receive the first adjustable inverter driver output signal and fourth inverter output signal combined to provide a third adjustable inverter driver output signal; and wherein the fifth inverter is configured to receive the second inverter output signal and second adjustable inverter driver output signal combined, wherein the sixth inverter output signal and third adjustable inverter driver output signal are combined to provide a first duty cycle corrected clock signal.

8. The apparatus of claim 7, wherein the plurality of inverters further comprises:

a seventh inverter configured to receive the fourth inverter output signal and first adjustable inverter driver output signal combined and provide a seventh inverter output signal;

an eighth inverter configured to receive the seventh inverter output signal and provide an eighth inverter output signal;

wherein the plurality of adjustable inverter drivers further comprises a fourth adjustable inverter driver configured to receive the second inverter output signal and provide a fourth adjustable inverter driver output signal; and wherein the eighth inverter output signal and fourth adjustable inverter driver output signal are combined to provide a second duty cycle corrected clock signal.

9. The apparatus of claim 4, wherein the plurality of inverters further comprises:

a first inverter configured to receive the first duty cycle corrected interpolated clock signal and provide a first inverter output signal;

a second inverter configured to provide a second inverter output signal;

a third inverter configured to provide a third inverter output signal;

a fourth inverter configured to receive the second duty cycle corrected interpolated clock signal and provide a fourth inverter output signal;

a fifth inverter configured to receive the first inverter output signal and third inverter output signal combined and provide a fifth inverter output signal;

a sixth inverter configured to provide a sixth inverter output signal;

wherein the plurality of adjustable inverter drivers further comprises:

a first adjustable inverter driver configured to receive the first duty cycle corrected interpolated clock signal and provide a first adjustable inverter driver output signal;

a second adjustable inverter driver configured to receive the second duty cycle corrected interpolated clock signal and provide a second adjustable inverter driver output signal;

a third adjustable inverter driver configured to receive the second inverter output signal and fourth inverter output signal combined to provide a third adjustable inverter driver output signal; and wherein the second inverter is configured to receive the first adjustable inverter driver output signal, wherein the third inverter is configured to receive the second adjustable inverter driver output signal, wherein the sixth inverter is configured to receive the third adjustable inverter driver output signal, and wherein the fifth inverter output signal and sixth inverter output signal are combined to provide a first duty cycle corrected clock signal.

10. The apparatus of claim 9, wherein the plurality of inverters further comprises:

a seventh inverter configured to provide a seventh inverter output signal;

an eighth inverter configured to receive the fourth inverter output signal and second inverter output signal combined and provide an eighth inverter output signal;

wherein the plurality of adjustable inverter drivers further comprises a fourth adjustable inverter driver configured to receive the first inverter output signal and third inverter output signal combined to provide a fourth adjustable inverter driver output signal;

wherein the seventh inverter is configured to receive the fourth adjustable inverter driver output signal, and wherein the seventh inverter output signal and eighth output signal are combined to provide a second duty cycle corrected clock signal.

11. The apparatus of claim 4, wherein the plurality of inverters further comprises:

a first inverter configured to receive the first duty cycle corrected interpolated clock signal and provide a first inverter output signal;

a second inverter coupled to the first inverter and configured to provide a second inverter output signal;

a third inverter configured to receive the second duty cycle corrected interpolated clock signal and provide a third inverter output signal;

a fourth inverter coupled to the third inverter and configured to provide a fourth inverter output signal;

wherein the plurality of adjustable inverter drivers further comprises:

a first adjustable inverter driver coupled to the third inverter and configured to provide a first adjustable inverter driver output signal;

a second adjustable inverter driver coupled to the first inverter and configured to provide a second adjustable inverter driver output signal;

a third adjustable inverter driver coupled to the fourth inverter and configured provide a third adjustable inverter driver output signal;

a fourth adjustable inverter driver coupled to the second inverter and configured to provide a fourth adjustable inverter driver output signal;

wherein the first adjustable inverter driver is configured to receive the third inverter output signal and second adjustable inverter driver output signal combined, wherein the second adjustable inverter driver is configured to receive the first inverter output signal and first adjustable inverter driver output signal combined;

wherein the second inverter is configured to receive the first inverter output signal and first adjustable inverter driver output signal combined, wherein the fourth inverter is configured to receive the third inverter output signal and second adjustable inverter driver output signal combined, wherein the third adjustable inverter driver is configured to receive the fourth inverter output signal and fourth adjustable inverter driver output signal combined, wherein the fourth adjustable inverter driver is configured to receive the second inverter output signal and third adjustable inverter driver output signal combined, and wherein the second inverter output signal and third adjustable inverter driver output signal are combined to provide a first duty cycle corrected clock signal.

12. The apparatus of claim 11, wherein the fourth inverter output signal and the fourth adjustable inverter driver output signal are combined to provide a second duty cycle corrected clock signal.

13. A method, comprising:

providing first and second clock signals;

responsive to the first clock signal, providing first and second split clock signals, the first and second split clock signals complementary to one another;

responsive to the second clock signal, providing third and fourth split clock signals, the third and fourth split clock signals complementary to one another;

interpolating the first and fourth split clock signals to provide a first duty cycle corrected interpolated clock signal;

interpolating the second and third split clock signals to provide a second duty cycle corrected interpolated clock signal, the first and second duty cycle corrected interpolated clock signals approximately 180 degrees out of phase relative to one another; and adjusting a duty cycle of at least one of the first and second duty cycle corrected interpolated clock signals to provide a duty cycle corrected output clock signal.

14. The method of claim 13, further comprising providing the second duty cycle corrected interpolated clock signal as a feedback signal for interpolating the first and fourth split clock signals to provide the first duty cycle corrected interpolated clock signal, and wherein the first duty cycle corrected interpolated clock signal is based at least in part on the second duty cycle corrected interpolated clock signal.

15. The method of claim 14 further comprising providing the first duty cycle corrected interpolated clock signal as a feedback signal for interpolating the second and third split clock signals to provide the second duty cycle corrected interpolated clock signal, and wherein the second duty cycle corrected interpolated clock signal is based at least in part on the first duty cycle corrected interpolated clock signal.

16. The method of claim 13 wherein providing first and second clock signals comprises:
providing first and second clock signals approximately 180 degrees out of phase relative to one another within three clock cycles of a input clock signal from which the first and second clock signals are based.

17. The method of claim 16 wherein providing first and second clock signals approximately 180 degrees out of phase relative to one another within three clock cycles of a input clock signal from which the first and second clock signals are based comprises:
determining a number of first delay stages representing a length of a clock cycle of the input clock signal; and
propagating the input clock signal through a number of second delay stages, wherein the second delay stages have second unit delays that are one-half of first unit delays of the first delay stages.

18. The method of claim 13 further comprising:
adjusting a duty cycle of the first duty cycle corrected interpolated clock signal based at least in part on the second duty cycle corrected interpolated clock signal.

19. The method of claim 18 wherein further comprising:
adjusting a duty cycle of the second duty cycle corrected interpolated clock signal based at least in part on the first duty cycle corrected interpolated clock signal.

20. An apparatus, comprising:
a clock generator circuit configured to provide first and second clock signals responsive to an input clock signal, the second clock signal being approximately 180 degrees out of phase with the first clock signal;
a duty phase interpolator circuit coupled to the clock generator circuit, the duty phase interpolator circuit comprising first and second phase splitter circuits and a first phase interpolator circuit,
the first phase splitter circuit configured to receive the first clock signal and provide a first split clock signal and a second split clock signal responsive to the first clock signal, the first and second split clock signals complementary to one another;
the second phase splitter circuit configured to receive the second clock signal and provide a third split clock signal and a fourth split clock signal responsive to the second clock signal, the third and fourth split clock signals complementary to one another;
the first phase interpolator circuit coupled to the first and second phase splitter circuits and configured to receive the first and fourth split clock signals and provide a first duty cycle corrected interpolated clock signal responsive thereto.

21. The apparatus of claim 20, wherein the duty phase interpolator circuit further comprises a second phase interpolator circuit coupled to the first and second phase splitter circuits and configured to receive the second and third split clock signals and provide a second duty cycle corrected interpolated clock signal responsive thereto.

22. The apparatus of claim 21, the apparatus further comprising:
a duty cycle adjuster circuit coupled to the duty phase interpolator circuit and configured to receive the first and second duty cycle corrected interpolated clock signals and provide a duty cycle corrected clock signal responsive thereto.

23. The apparatus of claim 21, wherein the first phase interpolator circuit is further configured to receive the second duty cycle corrected interpolated clock signal.

24. The apparatus of claim 20,
wherein the first phase interpolator circuit comprises first and second transistors of a first conductivity type coupled in series between a first node and a second node, and third and fourth transistors of a second conductivity type coupled in series between a third node and the second node,
wherein the first and fourth transistors receive the first split clock signal at the respective gate thereof, and
wherein the second and third transistors receive the fourth split clock signal at the respective gate thereof.

* * * * *